Aug. 31, 1965 R. H. PARMENTER 3,204,116

SOLID STATE SUPERCONDUCTOR SWITCHING DEVICE WHEREIN EXTRACTION OF NORMAL CARRIERS CONTROLS SUPERCONDUCTIVITY OF SAID DEVICE

Filed July 31, 1961

3 Sheets-Sheet 1

INVENTOR.
ROBERT H. PARMENTER
BY
W. S. Hill
AGENT

Aug. 31, 1965 R. H. PARMENTER 3,204,116

SOLID STATE SUPERCONDUCTOR SWITCHING DEVICE WHEREIN EXTRACTION OF NORMAL CARRIERS CONTROLS SUPERCONDUCTIVITY OF SAID DEVICE

Filed July 31, 1961

3 Sheets-Sheet 2

INVENTOR.
ROBERT H. PARMENTER
BY
W.S. Hier
AGENT

INVENTOR.
ROBERT H. PARMENTER
BY
W. B. Hill
AGENT

United States Patent Office 3,204,116
Patented Aug. 31, 1965

3,204,116

SOLID STATE SUPERCONDUCTOR SWITCHING DEVICE WHEREIN EXTRACTION OF NORMAL CARRIERS CONTROLS SUPERCONDUCTIVITY OF SAID DEVICE

Robert H. Parmenter, Princeton, N.J., assignor to Radio Corporation of America, a corporation of Delaware Filed July 31, 1961, Ser. No. 128,249
15 Claims. (Cl. 307—88.5)

Figure 3A:
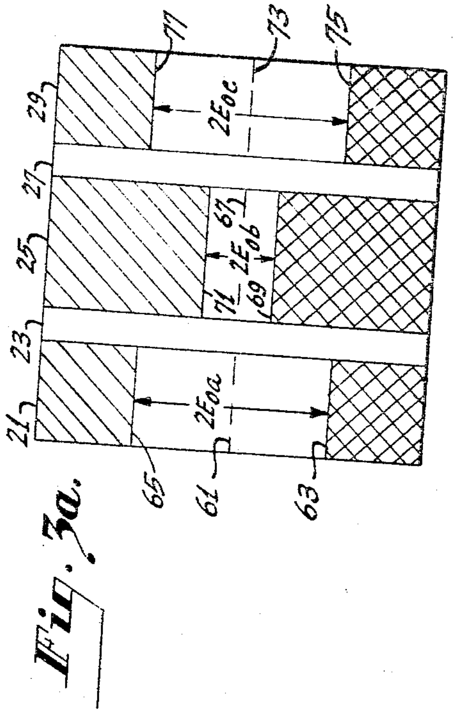

This invention relates to a novel solid state device which operates at temperatures near absolute zero. In particular, the invention relates to a four-terminal device which may be used as an active element for amplifying or switching operations in electronic circuits.

Certain materials, referred to herein as superconductors, exhibit two conditions of resistance to the flow of electric current through a body of the material. These conditions are the normal condition and the superconducting condition. At or above a transition or critical temperature $T_c$, a body of a superconductor is in the normal condition whereby there is a resistance to the flow of electric current. Below the critical temperature, the body of a superconductor is in the superconducting condition whereby there is no resistance to the flow of electric current. Materials which exhibit a normal condition and do not exhibit a superconducting condition are referred to herein as normal materials.

It is known that a body of a superconductor can be switched from the superconducting condition to the normal condition by applying thereto a sufficiently large magnetic field, or by raising the temperature of the body above its critical temperature, or by passing therethrough a sufficiently large electric current equal to or greater than a current called the critical current. It is also known that certain metal-insulator-metal two-terminal structures at temperatures near absolute zero exhibit a non-linear resistance when one metal is superconducting, and a negative resistance when both metals are superconducting. See, for example Physical Review Letters, 5, pages 147, 148, and 461 to 466. According to the theory set forth in these references, a superconductor has an energy band gap for charge carriers when it is below its critical temperature $T_c$. This energy band gap increases with decreasing temperature. Electrons having an energy lower than that of the energy band gap are coupled to one another and are said to be superconducting electrons. At temperatures near absolute zero, and below the critical temperature, there is also a small population of thermally-generated normal charge carriers (electrons above the energy gap and holes below the energy gap). Normal charge carriers are not coupled to one another and can tunnel through a thin electrical insulator which contacts the superconductor. Superconducting charge carriers cannot tunnel through such an insulator.

It is an object of this invention to provide a novel solid state device which operates at temperatures near absolute zero.

A further object is to provide a solid state device which may be used in active functions of amplifying or switching in electronic circuits.

The invention is based on the idea that a body of a superconductor in the normal condition may be switched to the superconducting condition by extracting normal carriers therefrom, and that a body of a superconductor in the superconducting condition may be switched to the normal condition by injecting normal carriers into the body. Normal carrier extraction reduces the population of normal carriers in the body and effectively results in electronic cooling of the body, while normal carrier injection increases the population of normal carriers in the body and effectively results in electronic heating of the body.

The device of the invention comprises a first region (or emitter) composed of a superconductor, a second region (or base) composed of a superconductor spaced from the first region by a thin electrically-insulating layer, and a third (or collector) region composed of a superconductor spaced from the second region by a second thin electrically-insulating layer. By thin, it is meant that the insulating layers have a thickness (transverse cross-sectional dimension) such that normal charge carriers can tunnel therethrough. The insulating layers are preferably 6 to 60 A.U. (Angstrom Units) thick. The regions are further related to one another so that the second region has a smaller energy band gap than the energy band gaps of the first and third regions. The first and third regions have the same or substantially the same energy band gaps.

In one mode of operation, the device is operated at a temperature which is just below the critical temperature of the second region. An output current is made to flow through the second region and through an external circuit. When a sufficiently high control voltage is applied across the first and third regions, carriers are injected into the base abruptly increasing the population of normal carriers, switching the second region to the normal condition, and decreasing the output current flowing through the base. Upon suitable adjustment of the control voltage, normal carrier injection into the second region is stopped, injected carriers recombine in the second region and the band gap is re-established. Thus, the control voltage is used to establish or quench superconductivity in the second region thereby controlling the amount of output current flowing in the load circuit.

In a second mode of operation, the device of the invention is operated just above the critical temperature of the second region. An output current is made to flow through the second region and through an external load circuit. A suitable control voltage is applied across the first and third regions so that normal electrons are extracted by one of the regions from the second region and normal holes are extracted simultaneously by the other of the regions from the second region. This extraction of normal charge carriers from the second region switches the second region into the superconducting condition and thereby increases the output current. If the applied control voltage is further increased, the second region may be switched to the normal condition, as described in the first mode of operation. Or, the control voltage may be lowered to a suitable value, so that the extraction of normal charge carriers is stopped and thermal generation of normal carriers in the second region switches the second region to the normal condition. Thus, the control voltage is used to establish or quench superconductivity in the second region, thereby controlling the amount of current passing in the load circuit.

Figure 3B:
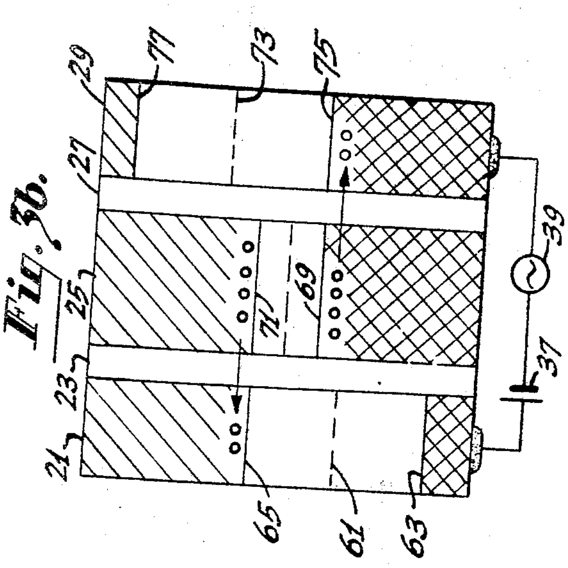
Figure 1:
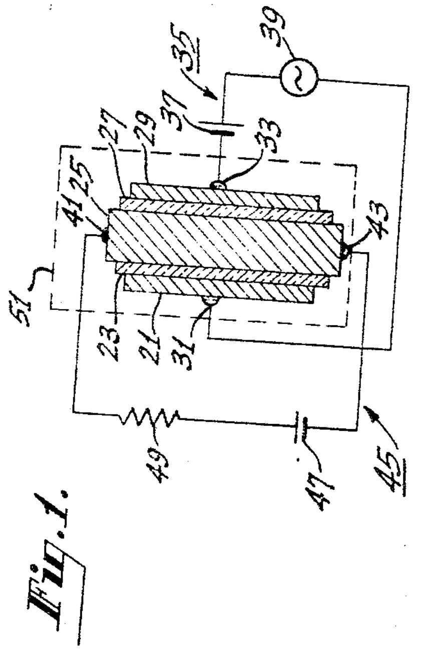
Figure 2:
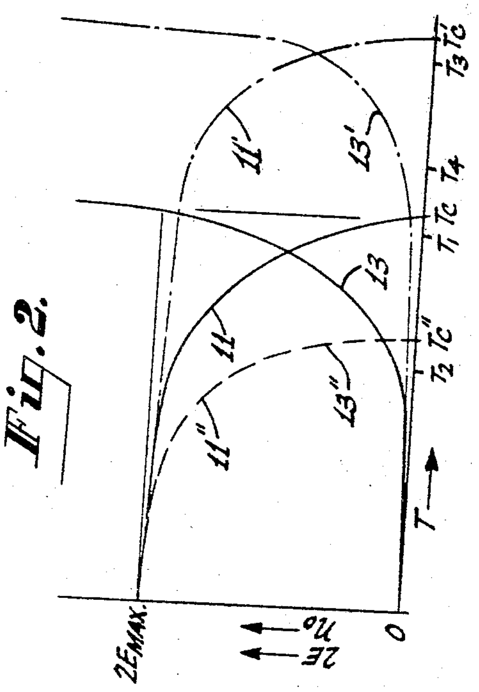
Figures 3C, 4, 5, 6A, 6B:
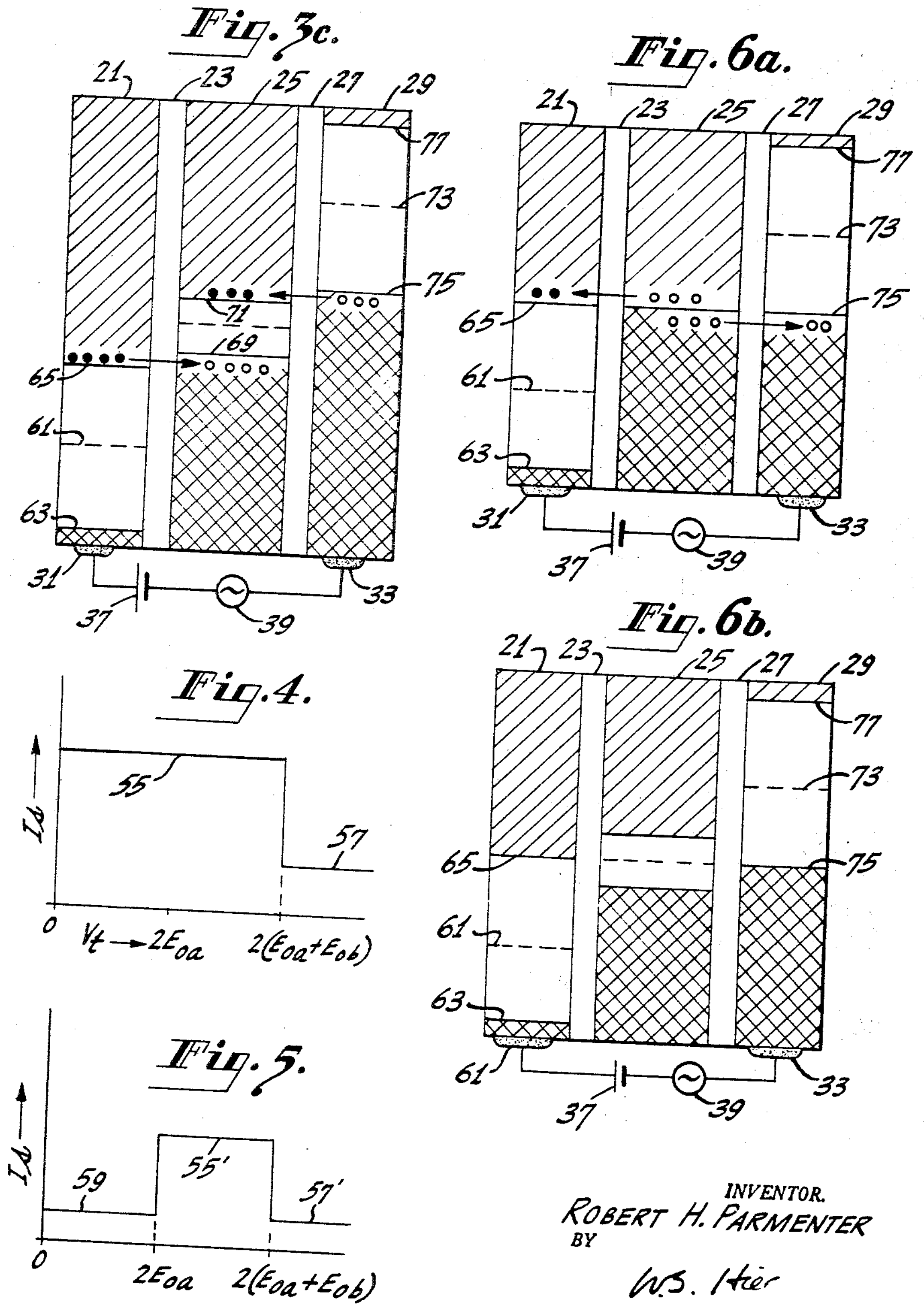
Figure 7:
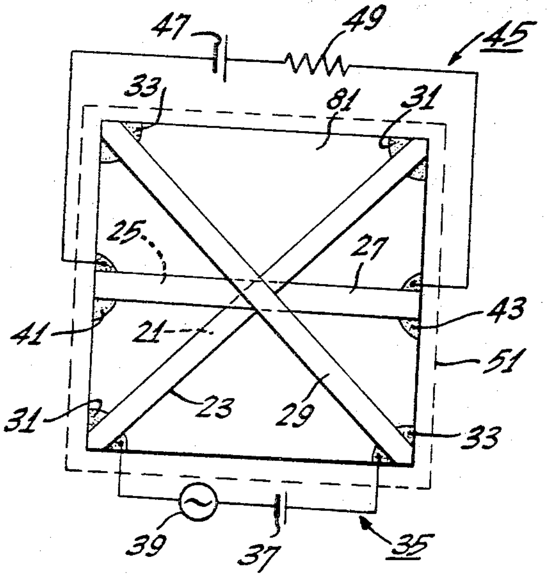
Figure 8:
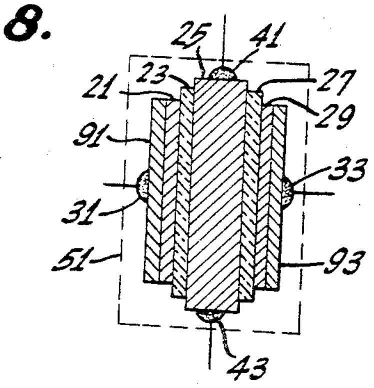

A more detailed description of several embodiments of the invention is set forth below in connection with the drawings in which:

FIGURE 1 is a partially schematic, partially sectional view of the first embodiment of the invention, FIGURE 2 is a graph showing the relationship of band gap, normal carrier density and temperature in a superconductor, FIGURES 3*a*, 3*b* and 3*c* are energy diagrams to aid in understanding the first mode of operation of the device of FIGURE 1, FIGURE 4 is an $I_s$–$V_t$ curve for the device of FIGURE 1 operated in a first mode of operation, FIGURE 5 is an $I_s$–$V_t$ curve for the device of FIGURE 1 operated in the second mode of operation, FIGURES 6*a* and 6*b* are energy diagrams to aid in understanding the second mode of operation of the device of FIGURE 1, FIGURE 7 is a plan view of a second embodiment of the invention including a supporting substrate, and FIGURE 8 is a sectional view of a third embodiment of the invention including sinks for normal charge carriers.

Similar reference numerals are used for similar elements throughout the drawings.

A first embodiment of the invention, illustrated in FIGURE 1, comprises a plurality of adjacent layers in the following order: a first region or emitter 21, a first thin electrically-insulating layer 23, a second region or base 25, a second thin electrically-insulating layer 27 and a third region or collector 29. Each of the emitter 21, the base 25 and the collector 29 consists of a superconductor. A superconductor exhibits an energy band gap $2E_o$ below a critical temperature $T_c$. This energy band gap increases with decreasing temperaure until it reaches a maximum value of $2E_o$ at absolute zero in temperature. A typical relationship of band gap at thermal equilibrium versus temperature is illustrated by the curve 11 in FIGURE 2. Generally, the higher the critical temperature the larger the maximum energy band gap. Some suitable superconductors and their calculated maximum energy band gaps and critical temperatures are shown in Table 1.

The emitter 21, the base 25 and the collector 29 are further related to one another in that the emitter 21 and the collector 29 are of superconductors that have the same or about the same energy band gaps $2E_{oa}$ and $2E_{oc}$ respectively. The superconductor of the base 25 has a smaller energy band gap $2E_{ob}$ than the superconductors of the emitter 21 and the collector 29. These are relative considerations so that any of the materials in Table 1 may be selected for any of the regions, provided the size of the energy band gap with respect to that of the other regions satisfies the relationship first described.

The first and second insulating layers 23 and 27 may be of aluminum oxide, such as is produced by oxidation of aluminum metal; or of silicon dioxide deposited from evaporated material; or of an organic material such as barium stearate or chromium stearate deposited by adsorption to the surface of one of the regions. The first and second insulating layers 23 and 27 should be thick enough to block superconducting charge carriers from passage therethrough, but thin enough to allow appreciable tunneling of normal charge carriers therethrough. Generally, the insulating layers should be of substantially uniform thickness between 6 and 60 A.U. thick. The insulating layers 23 and 27 should also be free of pin holes and other discontinuities so that the passages of charge carriers therethrough is substantially uniform. A thickness in the range between 10 and 30 A.U. is a reasonable choice. In the case of barium stearate, the layer is a monomolecular film about 40 to 60 A.U. thick.

The thicknesses of the emitter 21 and the collector 29 may be 10,000 A.U. or any larger thickness which is convenient. The thickness of the base 25 between the emitter and collector is preferably less than a diffusion length for normal charge carriers. The thickness of the base should also be small enough to achieve efficient extraction of normal carriers. Base thicknesses between 50 and 200 A.U. have been found to be convenient. The device is symmetrical about the base 25 and the functions of emitter 21 and collector 29 are interchangeable, one for the other.

An emitter connection 31 and a collector connection 33 are made to the emitter 21 and to the collector 29 respectively. A pair of base connections 41 and 43 are made to the base 25. The base connections are along an axis and define the ends of a current bath for superconducting charge carriers transverse to the thickness dimension of the base 25. The emitter 21 and the collector 29 define the ends of a current path for normal charge carriers through the insulating layers and through the base. The various connections 31, 33, 41 and 43 provide low resistance, non-rectifying contacts to the respective regions which they contact.

A first battery 37 and a signal source 39 are connected to one another in series and to the emitter connection 31 and the collector connection 33 in a control circuit 35. A current source 47 and a load 49 are connected to one another in series to the pair of base connections 41 and 43 in a load circuit 45.

In operation, the device is placed in a cryostat or other means 51 for maintaining the device at an operating temperature close to absolute zero, and at which at least the emitter 21 and collector 29 are superconducting. The critical temperature of the base 25 should be closer to the operating temperature than to the critical temperatures of the emitter 21 and the collector 29. The means 51 may comprise, for example, an insulating container and cooling means, such as a bath of liquid helium, or means for evaporating liquid helium in the region adjacent the device. The device is typically operated at or near the boiling point of liquid helium.

In one mode of operation, the device is placed at a low operating temperature $T_1$ such that the emitter 21, the base 25, and the collector 29 are superconducting. The current source 47 produces a load current $I_s$ in the load circuit 45. As the control voltage $V_t$ from the signal source 39 is increased from zero, the load current $I_s$ at first remains constant (curve 55 in FIGURE 4) being limited by the load 49. At a voltage about $$(E_{oa}+E_{oc}+2E_{ob})\cong 2(E_{oa}+E_{ob})$$

the base switches to the normal condition and the load current drops to some lower value (curve 57 of FIGURE 4).

FIGURE 3*a* illustrates the relationships of the energy gaps in the superconducting regions of the device with no bias applied. The Fermi level is shown by the dotted line 61 in the emitter, 67 in the base, and 73 in the collector, and extends at the same energy level throughout the device. The emitter 21 exhibits an energy band gap $2E_{oa}$ between the levels 63 and 65. The base 25 exhibits a smaller energy band gap $2E_{ob}$ between the levels 69 and 71, which levels will be used as the reference levels in the description below of the operation of the device. The collector 29 exhibits an energy band gap $2E_{oc}$ between the levels 75 and 77. The values of $E_{oa}$ and $E_{oc}$ are substantially the same.

As shown in FIGURE 3*b*, when the emitter 21 is biased positively with respect to the base 25, the energy levels 63 and 65 move down with respect to the energy levels 69 and 71 in the base 25. When the collector 29 is biased negatively with respect to the base 25, the energy levels 75 and 77 in the collector, move upward with respect to the energy levels 69 and 71 in the base 25. When the emitter 21 and the collector 29 are biased as shown in FIGURE 3*b*, normal electrons are extracted by the emitter 21 from the base 25 and normal holes are extracted by the collector 29 from the base 25. The effect of the extraction is to reduce the population $n_o$ of normal free carriers in the base 25. The curve 13 of FIGURE 2 illustrates the thermal equilibrium curve of population $n_o$ of normal carriers versus temperature. The carrier extraction process reduces the population from that of $T_1$ to that of $T_2$ on the curve 13, and widens the band gap $2E_{ob}$ from that of $T_1$ to that $T_2$ on the curve 11. The load current $I_s$ remains essentially the same as illustrated in the upper portion of the curve 55 of FIGURE 4.

When the voltage is increased above about $2(E_{oa}+E_{ob})$ the energy bands shift to positions shown typically in FIGURE 3*c*. Normal holes are injected from the emitter 21 into the base 25 and normal electrons are injected from the collector 29 into the base 25. Both the injection of normal electrons and the injection of normal holes take place by a tunneling process through the first and second insulating layers 23 and 27. The effect of this injection of normal carriers is to suddenly increase the population $n_o$ of normal carriers in the base 25, thereby switching the base 25 to the normal condition. Referring again to FIGURE 2, this corresponds to raising the temperature of the body to a value at $T_3$. Upon reducing the control voltage $V_t$, normal carrier injection ceases, normal carriers in the base recombine or are extracted, and the base 25 switches back to the superconducting condition.

In a second mode of operation, the device of FIGURE 1 is held at temperature $T_4$, slightly above the ordinary critical temperature $T_c$ of the base 25. A control voltage $V_t$ is applied across the connections 41 and 43 in the same manner as described above. The $I_s$–$V_t$ curve is shown in FIGURE 5. When $V_t=0$, the base 25 is in the normal condition and $I_s$ is at some low value. As $V_t$ is increased, $I_s$ remains constant as shown by the curve 59. At $V=2E_{oa}$, the base 25 switches to the superconducting condition and $I_s$ increases to some higher value 55'. The value of $I_s$ remains constant as $V_t$ is further increased until $V=2(E_{oa}+E_{ob})$, at which point the base 25 again switches to the normal condition, and $I_s$ is reduced to some low value as shown by the curve 57'.

At $V_t=0$ in the second mode of operation, the energy diagram for the device is similar to that of FIGURE 3*a*, except that there is no energy gap $2E_{ob}$ in the base 25. FIGURE 6*a* shows the energy diagram at $V=2E_{oa}$ just before switching. The bands in the emitter 21 have moved downward and the bands in the collector 29 have moved upward with respect to the bands in the base 25. The emitter 21 extracts electrons from the base 25 and the collector 29 extracts holes from the base 25. The extraction of normal charge carriers reduces the population $n_o$ of normal carriers in the base 25 and electronically cools the base to a lower temperature, typically $T_2$, below the ordinary critical temperature $T_c$, (see FIGURE 2), so that the base 25 becomes superconducting. FIGURE 6*b* shows the energy diagram at $V=2E_{oa}$ just after the base has switched to the superconducting condition. Upon switching to the superconducting condition, the base exhibits an energy band gap $2E_{ob}$. When $V_t$ is further increased, the base 25 switches back to the normal condition at and above $V_t=2(E_{oa}+E_{ob})$ as described with respect to FIGURES 3*c*.

The foregoing switching of conditions of the base 25 may also be explained by the curves of FIGURE 2. With the control voltage $V_t$ applied, the values of band gap $2E_{ob}$ and normal carrier population $n_o$ in the base 25 at thermal equilibrium are shown typically by the curves 11 and 13 respectively. During extraction of normal carriers, the values of $2E_{ob}$ and $n_o$ are shifted to higher effective temperature $T_c'$ as shown by the curves 11' and 13' respectively. During injection of normal carriers, the values of $2E_o$ and $n_o$ are shifted to a lower effective temperature $T_c''$ as shown by the curves 11'' and 13'' respectively. The effect of the control voltage $V_t$ is to shift electronically the effective temperature of the base 25.

A more formal analysis of a theory for the foregoing switching phenomena is now given. We designate by $\tau$ the lifetime against normal electron-hole recombination and by $n'$ the density of normal electrons (or holes) in a superconductor in the superconducting condition under thermal equilibrium conditions. Thus $n'/\tau$ is the normal electron-hole pair generation rate per unit volume in the superconductor. (It is also the recombination rate.) Under conditions of extraction in the superconductor, we shall, for the moment, assume the normal pair generation rate is unchanged (i.e. that it remains $n'/\tau$). The recombination rate, however, will be reduced to $$(n''/n')^2\times(n'/\tau)$$

where $n''$ is the reduced density of normal electrons resulting from the extraction process. The factor $(n''/n')^2$ is a consequence of the fact that we are dealing with a bimolecular recombination process. We designate by L the thickness of a superconducting base film being subjected to extraction, by $\gamma$ the mean tunneling transition probability per collision of the normal carriers striking the insulating barriers, and by $V_f$ the velocity of the normal carriers (this being the Fermi velocity). The pair extraction rate per unit volume of superconducting film is $$\tfrac{1}{3}\, V_f(n''/2)(\gamma/L)$$

Upon setting the difference between the generation rate and the recombination rate equal to the extraction rate (i.e. dynamic equilibrium), we get $$\left[1-\left(\frac{n''}{n'}\right)^2-\left(\frac{\gamma\lambda}{6L}\right)\left(\frac{n''}{n'}\right)\right]\left(\frac{n'}{\tau}\right)=0 \qquad (1)$$

where $\lambda=V_f\tau$ is the mean free path against pair recombination under thermal equilibrium conditions if $$\frac{\gamma\lambda}{6L}\gg 1,\text{ than }\frac{n''}{n'}=\frac{6L}{\gamma\lambda}\ll 1 \qquad (2)$$

and the extraction process is very efficient. An order-of-magnitude lower limit to $\lambda$ is given by the normal state bulk electrical conductivity mean free path $\lambda_n$ as limited by lattice vibrations, $\lambda_n$ being a lower limit since it is harder to generate normal pairs thermally in a superconductor than in the corresponding normal metal. The real phonon absorbed in the generation process must have at least the gap energy in the case of the superconductor. (We visualize holes below the Fermi level and electrons above the Fermi level to be the current carriers in the normal metal.) Thus if the operating temperature is appreciably below the usual transition temperature of the superconductor, we can expect $\lambda>>\lambda_n$. Since $\lambda_n$ may be $10^{-2}$ cm. and $\tau\sim10^{-2}$—$10^{-3}$ under typical conditions, Eq. 2 shows that L, the superconducting film thickness, may be 100 A.U. or more and still have $$(n''/n')<<1$$

In carrying out the analysis of the extraction process, we have assumed spatial uniformity of $n''$ in the superconducting base film. This is a good approximation as long as $L<<\lambda$. We also assumed the pair generation rate to the unaffected by the extraction process. As we shall see, however, the superconducting energy gap may increase under conditions of extraction. If so, this implies a decrease of the generation rate with increasing extraction (fewer phonons are energetic enough to create pairs). Such a decrease of the generation rate does not invalidate the conclusions of the preceding paragraph.

A third assumption is that the density of normal carriers in the contacts (emitter and collector) is negligible compared with $n''$, the density in the superconducting base film, so that there is negligible tunneling of normal carriers from the contacts back into the film. This implies that there is an efficient method of getting rid of the normal carriers injected into the contacts. One way of accomplishing this is to plate each contact with an amount of normal metal. The latter serves as a sink for normal carriers injected into the contact, whenever the distance from the tunnelable barrier to the sink is less than a mean free path (for normal carriers in the contact). The sink is separated from the tunnelable barrier by a thickness of the contact of at least something of the order of the Pippard coherence distance ($10^{-4}$ cm.), and the sink itself should have a minimum thickness of similar size. This obviates the possibility that the sink is made superconducting by being upon a superconductor, or conversely that the contact has its superconductivity quenched by being upon the normal metal of the sink.

It should be pointed out that the superconductor in each contact contains either injected normal electrons or normal holes, but not both. The resulting space charge in each contact is compensated by an adjustment in the density of superconducting electrons (shift of the energy of the bottom of the conduction band in the contact relative to the Fermi level). This leads to a minute shift in the transition temperature of each contact. Such a shift is negligible compared with the shift of transition temperature of the superconducting base film due to extraction of normal carriers of both signs without change of the density of superconducting electrons.

The situation we are considerting represents a non-equilibrium condition. There are two general types of non-equilibrium conditions in a superconductor; (1) those where the lack of equilibrium is due to the superconducting electrons, so that dissipation processes do not occur; (2) those where the lack of equilibrium is due to the normal carriers, so that dissipation processes do occur (i.e. finite entropy production). Time-independent current flow in a superconducting wire is an example of the first type. Because of the lack of dissipation, it is possible to define a free energy, despite the lack of equilibrium. Specifically, one modifies the equilibrium free energy by adding a term equal to the product of the quantity being constrained times a Lagrangian multiplier. (The constraint, set by boundary conditions, is what causes disequilibrum.) For the example of D.C. current flow in a superconducting wire, the constraint is that imposed on the net current due to the superconducting electrons.

The extraction of normal carriers represents a non-equilibrium situation of the second type where dissipation processes occur. There is a certain amount of thermolectric cooling in the superconducting base film being exhausted of normal carriers, and a still greater amount of heating in the contacts. For example, under the bias conditions of FIGURE 3*b* heat is removed from the film at the rate $I(2E_{ob/e})$ and is liberated in each contact at the rate $I(E_{oa/e})$ when extraction is efficient. (Here I is the total current, and *e* is the electronic charge.) The removal of heat in the film occurs when phonos are absorbed in making normal hole-electron pairs. Because of backflow of heat from the contacts into the base film, the actual temperature drop of the base film is probably small enough to be ignored. Nevertheless, the presence of dissipation associated with this thermolelectric process makes it difficult to define any sort of free energy F such that the minimization of F will lead to a description of steady-state equilibrium.

A generalization of the BCS theory to such a non-equilibrium situation can be made in the following manner. A Boltzmann transport equation is set up for the distribution function $f_k$ associated with the normal carriers (normal electrons for $k>k_f$, and normal holes for $k<k_f$, $\vec{k}$ being the wave vector labeling the single-particle states, and $k_f$ being the Fermi wave vector). At the same time, the internal energy U is minimized with respect to the parameters $h_k$ appearing in the BCS many-electron wave functions. Such a minimization leads to the equation $$[N(O)V]^{-1}=\int_0^{w}(\epsilon_k^2+E_o^2)^{-1/2}(1-2f_k)d\epsilon_k$$

Here N(O)V and $w$ are constraints characteristic of the superconductor, $\epsilon_k$ is the single-electron Block energy (measured with respect to the Fermi level), $2E_o$ is the energy gap, and $(\epsilon_k^2+E_o^2)^{1/2}$ is the energy of a normal carrier in the superconductor (also measured with respect to the Fermi livel). Eq. 3 is formally the same as that of the BCS theory; the only difference lies in the fact that the $f_k$ contained therein is obtained from a Boltzmann transport equation rather than from a minimization of a free energy with respect to $f_k$.

Of course, it is possible to have a non-equilibrium situation where both the superconducting electrons and the normal carriers contribute to the disequilibrium. For such a situation, one should solve a Boltzmann equation for $f_k$ and at the same time minimize the internal energy U with respect to $h_k$ subject to the constraint on the superconducting electrons causing their disequilibrium. Such a situation arises in the particular physical problem of the superconducting film with extracting electrodes if we choose to make a supercurrent flow in the film parallel to the plane of the film at the same time that we are extracting normal carriers from the film.

For the moment, we return to the case where there is no supercurrent in the superconducting film. Boltzmann's equation for our problem reduces to the statement that the total time of change of $f_k$ vanishes, the three processes of normal-pair thermal generation, normal-pair recombination, and double extraction of normal carriers all contributing to $(df_k/dt)$. The extraction process is effective in lowering $f_k$ for all orientations of $\vec{k}$, despite the fact that only carriers moving nearly normal to the insulating interface have appreciable probability of tunneling. This lower of $f_k$ for all orientations is a consequence of the fact that those carriers reflected at the insulating interface are undoubtedly reflected diffusely, thus leading to rapid equilibration between isoenergetic carriers moving in different directions.

It is not really necesary to solve Boltzmann's equation for $f_k$. Under reasonable physical conditions, it appears that whenever extraction is efficient as a whole, i.e. whenever $(n''/n')<<1$, it will also happen that $$f_k<<1 \qquad (4)$$

This will hold for all $\vec{k}$ if the bias is adjusted such that normal carriers of all energies can tunnel (e.g. as in FIGURE 3*b*). [In contrast, under no-extraction conditions where $n'$ is appreciable, there will be a number of $f_k$ comparable with ½ and thus not satisfying 4.] It should be noted that the only way the temperature T can affect the energy gap $2E_o$, obtained by solving Eq. 3, is through the temperature dependence of $f_k$. However, as long as 4 holds true, then 3 will be independent of T, and we will obtain an $E_o$ equal to the BCS value at the absolute zero of temperature, even when T is above the usual superconducting transition temperature.

It would appear that, by means of electrical extraction, we can rise the transition temperature of the superconducting film. An upper limit to this new transition temperature will, of course, be set by $T_{ca}$, the transition temperature of the contacts. As the operating temperature approaches $T_{ca}$, the extraction efficiency will drop off because of the presence of thermally generated normal carriers in the contacts which may tunnel through the insulating layers into the superconducting film. It appears plausible that one should be able to start with the film in the normal state and by means of extraction cause the film to go superconducting, the operating temperature being less than $T_{ca}$ but greater than $T_{cb}$ (the usual transition temperature of the film). Conversely we should be able to lower the transition temperature of the film by injection of normal carriers as shown ir FIGURE 3*c*. By lowering the transition temperature below the operating temperature, we can drive the superconducting base film normal by electrical injection Using either injection or extraction, we have an electrica (non-magnetic) method of controlling a superconductin current in the film (the current flowing parallel t the plane of the film).

FIGURE 7 includes a plan view of a second embodi ment of the invention which employs a substrate. Th second embodiment is similar in its general structure t the first embodiment and the same reference numeral are given to similar structures. The device of FIGURI 7 comprises an electrically-insulating substrate 81 suc as a borosilicate glass in the form of a square. Severa pairs of electrode connections 31, 33, 41 and 43 c platinum metal adhere to the substrate 81 over a sma surface area near each edge of the substrate. Suc connections may be prepared by painting the area wit a platinum paint or a platinum resinate and then heating the substrate 81 with the painting thereon to about 400° C. to volatilize the organic material therein and to adhere the platinum metal.

For the present example, a lead metal emitter 21 in the form of a stripe about 10 mils wide and about 10,000 A.U. thick extends between and over the electrode connections 31. Such a lead electrode may be produced by evaporating lead metal upon the substrate 81 which has been suitably masked. A first insulating layer 23 is located over and in contact with the emitter electrode 21. The first insulating layer 23 is produced by oxidizing the surface of the lead of the emitter 21 as by exposure of the metal to air. The oxidized portion is a layer of lead oxide about 20 to 40 A.U. thick. The insulating layer 23 is an electrical insulator through which normal charge carriers can tunnel, but which blocks the passage of superconducting carriers. The insulating layer 23 may also be produced by chemical or electrolytic oxidation of the emitter material where the chemistry allows of this. Alternatively, the first insulating layer 23 may be produced by the evaporation of SiO or $SiO_2$.

An aluminum metal base 25 in the form of a stripe about 15 mils wide and about 50 A.U. thick, extends between and over the base conections 41 and 43. The stripe crosses over and contacts the insulating layer 23. Such an aluminum electrode may be produced by evaporating aluminum metal upon the substrate 81 which has been suitably masked. An insulating layer is located over and in contact with the base 25. In this embodiment, the second insulating layer 27 is produced by oxidizing the surface of the aluminum of the base to aluminum oxide as by chemical oxidation. The oxidized portion of the second insulating layer is about 20 to 40 A.U. thick.

A lead metal collector electrode 29 in the form of a strip about 10 mils wide and about 10,000 A.U. thick extends between and over the electrode connections 33. The electrode stripe 29 crosses over and contacts the insulating layer 27. The collector may be produced by the same techniques as the emitter 21, as by evaporating lead metal over the previous layers and substrate 81, which have been suitably masked. The base 25 overlies the emitter 21, and the collector 29 overlies the base 25 in a common region near the center of the substrate 81.

The embodiment of FIGURE 7 is connected into the same load circuit and control circuit as in the first embodiment, with identical connections to emitter 21, base 25, and collector 29, as indicated. The second embodiment as illustrated in FIGURE 7, may be operated by the first or second mode of operation as described for the first embodiment.

FIGURE 8 illustrates a third embodiment of the invention. The third embodiment is identical with the first embodiment illustrated in FIGURE 1 except that the emitter 21 is adjacent a normal metal sink 91 which covers substantially all of the emitter surface, and the collector 29 is adjacent a second normal metal sink 93 which covers substantially all of the collector surface. The emitter 21 and the collector 29 are each as thin as possible, but are more than about 10,000 A.U. thick (roughly the Pippard coherence distance). The sinks 91 and 93 are any convenient thickness greater than 10,000 A.U.

In the first and second embodiments, the population of normal carriers in the emitter 21 and the collector 29 is reduced to the thermal equilibrium value by removal of normal carriers into the external circuit or by disappearance of a pair of normal carriers with simultaneous change of the number of superconducting electrons. At very high normal carrier densities through the device, such processes may not be fast enough and the device may tend to saturate because the band gaps of the emitter and/or collector have been reduced in size.

This difficulty is overcome in the third embodiment.

At low normal carrier densities, the normal carrier populations in the emitter 21 and collector 29 are controlled as in the first embodiment. At high normal carrier densities, the excess normal carriers pass directly to the sinks 91 and 93 without recombination. The emitter 21 and collector 29 each are as thin as possible so that the normal carrier current path is as short as possible. However, the lower limit of thickness is limited by the tendency of the material to assume the condition of a larger body in which it is in contact. If the emitter 21 and collector 29 are made too thin they would tend to assume the normal condition of the sinks with which they are in contact.

*Table*

| Superconductor | $T_c$, ° K. | Energy Gap (T=0) [1] (millivolts) |
|---|---|---|
| Technetium (Tc) | 11.2 | 3.4 |
| Niobium (Nb) | 8.7 | 2.6 |
| Lead (Pb) | 7.2 | 2.7 |
| Lanthanum (La) | 5.4 | 1.6 |
| Vanadium (V) | 4.9 | 1.5 |
| Tantalum (Ta) | 4.4 | 1.3 |
| Mercury (Hg) | 4.2 | 1.3 |
| Tin (Sn) | 3.7 | 1.1 |
| Indium (In) | 3.4 | 1.1 |
| Thallium (Tl) | 2.4 | 0.7 |
| Rhenium (Re) | 1.7 | 0.5 |
| Thorium (Th) | 1.4 | 0.4 |
| Aluminum (Al) | 1.2 | 0.3 |
| Gallium (Ga) | 1.1 | 0.3 |
| Zinc (Zn) | 0.9 | 0.3 |
| Uranium (U) | 0.8 | 0.2 |
| Osmium (Os) | 0.7 | 0.2 |
| Zirconium (Zr) | 0.6 | 0.2 |
| Cadmium (Cd) | 0.6 | 0.2 |
| Ruthenium (Ru) | 0.5 | 0.1 |
| Titanium (Ti) | 0.4 | 0.1 |
| Hafnium (Hf) | 0.4 | 0.1 |

[1] (Energy gap at T=0° K. measured by tunneling in Pb, Sn, In, and Al. For other metals, it is assumed to be 3.5 $kT_c$, where $k$=0.086 millivolts/degree=Boltzmann's constant.)

I claim:

1. An electronic device comprising a base composed of a superconductor, means in contact with said base for extracting normal electrons from said base, means in contact with said base for extracting normal holes from said base, means for maintaining said base at temperatures at which said base is superconducting, and means connecting said electron-extracting means and said hole-extracting means operative to reduce simultaneously the densities of normal electrons and normal holes in said base below the densities existing at thermal equilibrium.

2. An electronic device comprising a base composed of a superconductor, means in contact with said base for extracting normal electrons from said base, means in contact with said base for extracting normal holes from said base in opposed spaced relationship with said electron-extracting means, means for maintaining said base at temperatures at which said base is superconducting, and means connecting said electron-extracting means and said hole-extracting means operative to reduce simultaneously the densities of normal electrons and normal holes in said base below the densities existing at thermal equilibrium.

3. An electronic device comprising a base composed of a superconductor, means in contact with said base for extracting normal electrons from said base and means in contact with said base for extracting normal holes from said base, means for maintaining said base at temperatures near the critical temperature of said base, and means connecting said electron-extracting means and said hole-extracting means operative to reduce simultaneously the densities of normal electrons and normal holes in said base below the densities existing at thermal equilibrium.

4. An electronic device comprising a base composed of a superconductor, means in contact with said base for extracting normal electrons from said base, means in contact with said base for extracting normal holes from said base in an opposed spaced relation with said electron-extracting means, means for applying a voltage across said electron-extracting means and said hole-extracting means, means for producing a current of charge carriers in said base, means for maintaining said base at temperatures at which said base is superconducting, and circuit means connecting said electron-extracting means and said hole-extracting means operative to reduce simultaneously the densities of normal electrons and normal holes in said base below the densities existing at thermal equilibrium.

5. An electronic device comprising a base composed of a superconductor, means in contact with said base for extracting normal electrons from said base, means in contact with said base for extracting normal holes from said base in an opposed spaced relation with said electron-extracting means, means for applying a voltage across said electron-extracting means and said hole-extracting means, means for producing a current of charge carriers in said base in the region spacing said electron-extracting means and said hole-extracting means, means for maintaining said base at temperatures at which said base is superconducting, and circuit means connecting said electron-extracting means and said hole-extracting means operative to reduce simultaneously the densities of normal electrons and normal holes in said base below the densities existing at thermal equilibrium.

6. An electronic device comprising a first region composed of a superconductor, a second region composed of a superconductor spaced from said first region by a first thin electrically-insulating layer, and a third region composed of a superconductor spaced from said second region by a thin electrically-insulating film; said second region having a smaller energy band gap for normal charge carriers than said first and third regions, and said first and third regions having energy band gaps of substantially the same size, and means for maintaining said device at temperatures at which said first and said third regions are superconducting.

7. An electronic device comprising a first region composed of a superconductor, a second region composed of a superconductor spaced from said first region by a first thin electrically insulating layer, a third region composed of a superconductor spaced from said second region by a thin electrically-insulating film; said second region having a smaller energy band gap for normal charge carriers than said first and third regions, and said first and third regions having energy band gaps of substantially the same size, and means for maintaining the temperature of said device at about the critical temperature of said second region.

8. An electronic device comprising a base composed of a superconductor, an emitter composed of a superconductor having two opposed surfaces more than 10,000 angstrom units apart, one of said emitter surfaces spaced from said base by a first thin electrically-insulating layer, a first body composed of a normal material contacting the other of said emitter surfaces, a collector composed of a superconductor having two opposed surfaces more than 10,000 angstrom units apart, one of said collector surfaces spaced from said base by a second thin electrically-insulating layer, a second body composed of a normal material contacting the other of said collector surfaces, said emitter and said collector having substantially the same energy band gaps and said base having an energy band gap smaller than the energy band gaps of said emitter and said collector, and means for maintaining said device at temperatures at which said emitter and collector are superconducting.

9. An electronic device comprising a base composed of a superconductor, an emitter composed of a superconductor having two opposed surfaces more than 10,000 angstrom units apart, one of said emitter surfaces spaced from said base by a first thin electrically-insulating layer about 6 to 60 angstrom units thick, a first body composed of a normal material contacting the other of said emitter surfaces, a collector composed of a superconductor having two opposed surfaces more than 10,000 angstrom units apart, one of said collector surfaces spaced from said base by a second thin electrically-insulating layer about 6 to 60 angstrom units thick, a second body composed of a normal material contacting the other of said collector surface, said emitter and said collector having substantially the same energy band gaps, and said base having an energy band gap smaller than the energy band gap of said emitter and said collector, and means for maintaining said device at temperatures at which said emitter and collector are superconducting.

10. An electronic device comprising a base composed of a superconductor, an emitter composed of a superconductor and having two opposed surfaces more than 10,000 angstrom units apart, one of said emitter surfaces spaced from said base by a first thin electrically-insulating layer about 6 to 60 angstrom units thick, a first body composed of a normal material contacting the other of said emitter surfaces, a collector composed of a superconductor and having two opposed surfaces more than 10,000 angstrom units apart, one of said collector surfaces spaced from said base by a second thin electrically-insulating layer about 6 to 60 angstrom units thick, a second body composed of a normal material contacting the other of said collector surface, said emitter and said collector having substantially the same energy band gaps, and said base having an energy band gap smaller than the energy band gap of said emitter and said collector, said emitter and collector being in opposed positions with respect to each other, and said first and second bodies being more than 10,000 angtrom units thick, and means for maintaining said device at temperatures at which said emitter and collector are superconducting.

11. An electronic device comprising a base composed of a superconductor, an emitter composed of a superconductor having two opposed surfaces more than 10,000 angstrom units apart, one of said emitter surfaces spaced from said base by a first thin electrically-insulating layer about 6 to 60 angstrom units thick, a first body composed of a normal material contacting the other of said emitter surfaces, a collector composed of a superconductor having two opposed surfaces more than 10,000 angstrom units apart, one of said collector surfaces spaced from said base by a second thin electrically-insulating layer about 6 to 60 angstrom units thick, a second body composed of a normal material contacting the other of said collector surfaces, said emitter and said collector having substantially the same energy band gaps, and said base having an energy band gap smaller than the energy band gaps of said emitter and said collector, said emitter and collector being in opposed positions with respect to each other, the dimension of said base between said emitter and said collector being less than a diffusion length for normal free carriers, and said first and second bodies being more than 10,000 angstrom units thick, and means for maintaining said device at temperatures at which said emitter and collector are superconducting.

12. An electronic device comprising a base composed of a superconductor and having two opposed surfaces, an emitter composed of a superconductor and spaced from one of said opposed surfaces by a first thin electrically insulating layer, a collector composed of a superconductor and spaced from the other of said opposed surfaces by a second thin electrically insulating layer, said emitter and collector having energy band gaps of substantially the same size, and said base having an energy band gap substantially smaller than the energy gaps of said emitter and collector, a pair of connections to said base, and means for maintaining said device at temperatures at which said emitter and collector are superconducting.

13. An electronic device comprising a base compound of a superconductor, an emitter composed of a superconductor having an energy band gap larger than the energy band gap of said base and spaced from said base by a thin electrically insulating layer, a collector composed of a superconductor having an energy band gap larger than the energy band gap of said base and spaced from said base by a second thin electrically insulating layer, a pair of low resistance connections to said base defining the ends of a current path of superconducting charge carriers through said base, and means for maintaining the temperature of said device at about the critical temperature of said base.

14. An electronic device comprising a base composed of a superconductor having two opposed surfaces, an emitter composed of a superconductor having an energy band gap larger than the energy band gap of said base and spaced from one of said opposed surfaces by a first electrically-insulating layer about 6 to 60 angstrom units thick, a collector composed of a superconductor having about the same energy band gap as the energy band gap of said emitter and spaced from the other of said opposed surfaces by a second electrically insulating layer about 6 to 60 angstrom units thick, a pair of connections to said base defining the ends of a current path of superconducting charge carriers through said base, and means for maintaining said device at temperatures at which said emitter and collector are superconducting.

15. An electronic device comprising a base composed of a superconductor, an emitter composed of a superconductor having an energy gap larger than the energy band gap of said base and spaced from said base by a first thin electrically-insulating layer about 6 to 60 angstrom units thick, a collector composed of a superconductor having an energy band gap larger than the energy band gap of said base and spaced from said base by a second thin electrically-insulating layer about 6 to 60 angstrom units thick, a pair of low resistance connections to said base defining the ends of a current path of superconducting charge carriers through said base, and means for maintaining said device at temperatures above absolute zero at which said base is superconducting.

References Cited by the Examiner

UNITED STATES PATENTS

| | | | |
|---|---|---|---|
| 2,938,160 | 5/60 | Steele. | |
| 2,989,714 | 6/61 | Park et al. | |
| 3,042,853 | 7/62 | Steele. | |
| 3,056,073 | 9/62 | Mead. | |
| 3,116,427 | 12/63 | Giaever | 307—88.5 |

OTHER REFERENCES

"Superconducting Tunneling Devices," I. Gaever, Feb. 15, 1961, 1961 International Solid-State Circuits Conference.

"Laminar Cryotronic Structures," in IBM Technical Disclosure Bulletin, April 1961, vol. 3, No. 11.

ARTHUR GAUSS, *Primary Examiner.*

JOHN W. HUCKERT, *Examiner.*

UNITED STATES PATENT OFFICE
CERTIFICATE OF CORRECTION

.tent No. 3,204,116 August 31, 1965

Robert H. Parmenter

It is hereby certified that error appears in the above numbered pat-
t requiring correction and that the said Letters Patent should read as
rrected below.

Column 3, line 51, for "passages" read -- passage --; ne 71, for "bath" read -- path --; column 4, line 65, after o that" insert -- of --; column 6, line 44, for "rate to the" ad -- rate to be --; column 7, line 9, for "considerting" ad -- considering --; line 59, for that portion of the formula ading $$\int_0^{\omega} \quad \text{read} \quad \int_0^{\hbar\omega}$$

me column 7, line 61, for "w" read -- $\hbar\omega$ --; line 66, for ivel" read -- level --; column 8, line 11, after "time" sert -- rate --; line 19, for "lower" read -- lowering --; ne 43, for "rise" read -- raise --; column 9, line 38, for trip" read -- stripe --; column 12, line 73, for "compound" ad -- composed --.

Signed and sealed this 12th day of July 1966.

EAL)
test:

NEST W. SWIDER
testing Officer

EDWARD J. BRENNER
Commissioner of Patents